United States Patent
Akutsu et al.

(10) Patent No.: US 8,361,614 B2
(45) Date of Patent: Jan. 29, 2013

(54) ANISOTROPIC ELECTRICALLY CONDUCTIVE FILM AND CONNECTION STRUCTURE

(75) Inventors: Yasushi Akutsu, Tochigi (JP); Daisuke Sato, Tochigi (JP); Shinichi Hayashi, Taipei (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 435 days.

(21) Appl. No.: 12/302,640

(22) PCT Filed: Apr. 22, 2008

(86) PCT No.: PCT/JP2008/057780
§ 371 (c)(1),
(2), (4) Date: Dec. 19, 2008

(87) PCT Pub. No.: WO2008/133253
PCT Pub. Date: Nov. 6, 2008

(65) Prior Publication Data
US 2009/0178834 A1   Jul. 16, 2009

(30) Foreign Application Priority Data
Apr. 25, 2007 (JP) ................................. 2007-115929

(51) Int. Cl.
*B32B 5/16* (2006.01)
*B32B 27/00* (2006.01)
(52) U.S. Cl. ....................................... 428/327; 428/500
(58) Field of Classification Search .................... 428/461
See application file for complete search history.

(56) References Cited

U.S. PATENT DOCUMENTS
6,777,464 B1 * 8/2004 Watanabe et al. ............. 523/457

FOREIGN PATENT DOCUMENTS
| JP | 2000-40418 A | 2/2000 |
| JP | 2003-268346 A | 9/2003 |
| JP | 3587859 B2 | 8/2004 |
| JP | 2005-325161 A | 11/2005 |

OTHER PUBLICATIONS

Machine translation of JP 2003-268346 Saito et al. (Sep. 2003).*
Machine translation of JP 2000-040418 Takechi et al. (Jul. 1998).*
Notification of Transmittal of Translation of the International Preliminary Report on Patentability (Chapter I or Chapter II of the Patent Cooperation Treaty) for International Application No. PCT/JP2008/057780, mailed on Nov. 19, 2009 (5 pages).
Patent Abstracts of Japan, Publication No. 2003-268346, dated Sep. 25, 2003, 1 page.
Patent Abstracts of Japan, Publication No. 2000-040418, dated Feb. 8, 2000, 1 page.
Patent Abstracts of Japan, Publication No. 2005-325161, dated Nov. 24, 2005, 1 page.
International Search Report issued in PCT/JP2008/057780, mailed on May 20, 2008, with translation, 2 pages.

* cited by examiner

*Primary Examiner* — Sheeba Ahmed
(74) *Attorney, Agent, or Firm* — Osha Liang LLP

(57) ABSTRACT

An anisotropic electrically conductive film formed by a thermosetting acrylic resin composition is disclosed. The composition contains at least a thermosetting agent (A), a thermo-settable ingredient (B), an acrylic rubber containing hydroxyl groups (C), organic fine particles (D) and electrically conductive particles (E). The thermo-settable ingredient (B) may include a phosphorus-containing acrylic ester (b1). The weight averaged molecular weight of the acrylic rubber containing the hydroxyl groups (C) is not less than 1000000. The organic fine particles (D) include polybutadiene-based fine particles (d1).

8 Claims, 1 Drawing Sheet

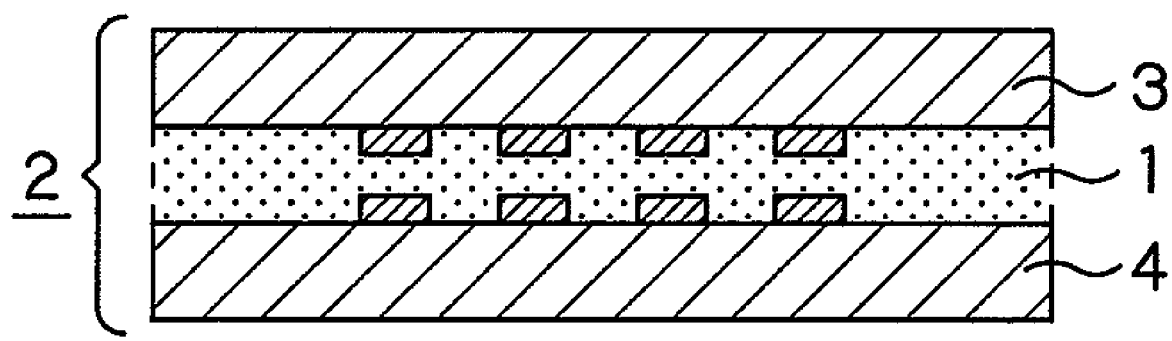

ANISOTROPIC ELECTRICALLY CONDUCTIVE FILM AND CONNECTION STRUCTURE

BACKGROUND OF THE INVENTION

1. Field of the Invention

This invention relates to an anisotropic electrically conductive film obtained on dispersing electrically conductive particles in a thermosetting acrylic resin composition and which exhibits a high adhesion strength, and to a connection structure that makes use of the same.

The present application claims priority rights based on the Japanese Patent Application 2007-115929, filed in Japan on Apr. 25, 2007. This patent application of the senior filing date is to be incorporated herein by reference.

2. Description of Related Art

In the field of the packaging technology, an anisotropic electrically conductive film has now come into widespread use because the film allows for a simpler connection process and also is lead-free. As this anisotropic electrically conductive film, such a film composed of a thermosetting epoxy resin composition was so far used in view of connection reliability and resistance against heat. Recently, the attention is focused on an anisotropic electrically conductive film formed of a thermosetting acrylic resin composition in order to meet the demand for shorter connection time and for a lower temperature.

With this type of the anisotropic electrically conductive film, those azo-based initiators and peroxide-based initiators, as curing agents, which are low in decomposition and activation temperatures, may selectively be used, as a result of which it is possible to carry out a packaging operation under heating and pressure application at a lower temperature of the range of 140 to 160° C. for a shorter time duration less than 10 sec.

Meanwhile, if an anisotropic electrically conductive film formed of an acrylic resin composition is compared to an anisotropic electrically conductive film formed of an epoxy resin composition, the former has deficiencies that are connected with low adhesion strength, such as a defect in the connection itself and in low conduction reliability subsequent to connection.

To solve this problem, such an anisotropic electrically conductive film in which a hydroxyl-containing resin, with a molecular weight not lower than 10000, is contained in the acrylic acid composition, and in which a phosphorus-containing acrylic ester is selectively used as the acrylic ingredient (thermo-settable ingredient), is now being searched as disclosed in Japanese Patent No. 3587859, for instance.

With this anisotropic electrically conductive film disclosed in the Japanese Patent No. 3587859, the adhesion strength with respect to a support material such as an electronic substrate may be expected to be elevated owing to the presence of the hydroxyl groups. However, in actual packaging operations, it is requested to raise the adhesion strength in a state the stress generated in the support material is relieved, that is, in a state the support material is not warped. It is not possible with the known film to satisfy the requirements which are contradictory to each other, that is, the requirement for achieving the elevated adhesion strength and the requirement for realization of a stress relieved state, at the same time.

That is, to meet these requirements which are contradictory to each other, it is felt to be necessary that a polymer ingredient of as high a molecular weight as possible is used as a resin material other than a ingredient that is responsible for contraction on curing (thermo-settable ingredient). However, the anisotropic electrically conductive film disclosed in Patent Publication 1 is not of a sufficiently high molecular weight. Specifically, there is a statement in Patent Publication 1 that a polymer material with a weight averaged molecular weight not less than 1000000 is inferior in its dissolution performance and is difficult to mix in the composition. While there is also a statement in Patent Publication 1 that the acrylic rubber is mixed in the composition to relax the stress as well as to elevate the force of cohesion of the adhesive, the molecular weight of the acrylic rubber is about 200000 at most.

That is, with the thermosetting acrylic resin composition in the past, it is difficult to elevate the adhesion strength in a stress-relieved state.

DISCLOSURE OF THE INVENTION

Problem to be Solved by the Invention

It is desirable to the present invention to provide an anisotropic electrically conductive film that may exhibit a high adhesion strength in the stress relieved state, and a connection structure employing the same.

An anisotropic electrically conductive film according to an embodiment of the present invention is formed of a thermosetting acrylic resin composition, the composition contains at least a thermosetting agent (A), a thermo-settable ingredient (B), an acrylic rubber containing hydroxyl groups (C), organic fine particles (D) and electrically conductive particles (E). The thermo-settable ingredient (B) includes a phosphorus-containing acrylic ester (b1). The weight averaged molecular weight of the acrylic rubber containing the hydroxyl groups (C) is not less than 1000000, and the organic fine particles (D) include polybutadiene-based fine particles (d1).

If, with the anisotropic electrically conductive film according to an embodiment of the present invention, the weight of the acrylic rubber containing the hydroxyl groups (C) is X, the weight of the phosphorus-containing acrylic ester (b1) is Y and the weight of the polybutadiene-based fine particles (d1) is Z, the weight ratio of the three ingredients X, Y and Z is such that X:Y:Z=2:0.05:10~8:0.05:16.

With the anisotropic electrically conductive film according to an embodiment of the present invention, the composition may further contain a phenoxy resin (F).

A connection structure according to an embodiment of the present invention includes a substrate and an electronic component connected to each other by the anisotropic electrically conductive film as defined above. The substrate has formed thereon an electrode pattern.

The anisotropic electrically conductive film according to an embodiment of the present invention is formed of a thermosetting acrylic resin composition, and contains a phosphorus-containing acrylic ester (b1) as the thermo-settable ingredient (B), while also containing polybutadiene-based fine particles (d1) as the organic fine particles (D), whereby the acrylic rubber of a high molecular weight may be dissolved and mixed in the acrylic resin composition. That is, in this manner, the acrylic rubber containing the hydroxyl-containing acrylic rubber (C) with the weight averaged molecular weight of not less than 1000000 may be contained in the acrylic resin composition. With the acrylic resin composition, containing the hydroxyl-containing acrylic rubber (C) with the molecular weight of not less than 1000000, a high adhesion strength may be attained in the stress-relieved state.

Moreover, with the anisotropic electrically conductive film, containing the three ingredients, that is, the phosphorus-containing acrylic ester (b1), the hydroxyl-containing acrylic rubber (C) and the polybutadiene-based fine particles (d1), in a proper weight ratio, a high adhesion strength not lower than 6 N/cm may be obtained in the stress-relieved state.

In case the phenoxy resin (F) is further contained in the anisotropic electrically conductive film according to an embodiment of the present invention, the anisotropic electrically conductive film may further be improved in its film-forming properties.

With the connection structure according to an embodiment of the present invention, the connection between the substrate and the electronic component may be improved in reliability to eliminate variations from one product to another. It is because the substrate, including an electrode pattern, deposited thereon, and the electronic component, are connected to each other by the anisotropic electrically conductive film that enables the high adhesion strength to be attained in the stress-relieved state.

Other purposes and advantages of the present invention will become more apparent from the following description of a preferred exemplary embodiment especially when read in conjunction with the drawings.

BRIEF DESCRIPTION OF THE DRAWINGS

FIGURE 1 is a cross-sectional view of a connection structure that uses an anisotropic electrically conductive film according to an embodiment of the present invention.

BEST MODES FOR CARRYING OUT THE INVENTION

An anisotropic electrically conductive film according to an embodiment of the present invention and a connection structure that makes use of the same will now be described in detail. The anisotropic electrically conductive film according to an embodiment of the present invention is used for connection of, for example, an electronic component and a substrate, carrying thereon an electrode pattern formed of ITO (indium tin oxide), to each other, and is specifically capable of elevating the adhesion strength in a stress relieved state.

In the following, respective ingredients that make up the present anisotropic electrically conductive film are explained in detail. It should be noted that the ingredients are given only for illustration and are not intended to restrict the present invention.

The ingredients that make up the anisotropic electrically conductive film include a thermosetting agent (A), a thermo-settable ingredient (B), an acrylic rubber containing hydroxyl groups (C), organic fine particles (D), electrically conductive particles (E) and a phenoxy resin (F). The thermo-settable ingredient (B) includes a phosphorus-containing acrylic ester (b1). The weight averaged molecular weight of the acrylic rubber containing hydroxyl groups (C) is not less than 1000000, and the organic fine particles (D) include polybutadiene-based fine particles (d1).

Meanwhile, the phenoxy resin (F) is not a fundamental ingredient of the anisotropic electrically conductive film according to an embodiment of the present invention. However, if the phenoxy resin (F) is contained in the anisotropic electrically conductive film, the latter is improved in film-forming properties.

The thermosetting agent (A) may be exemplified by azo-based and peroxide-based initiators that are low in decomposition temperatures and in activation temperatures. Of these, the peroxide-based initiators are preferred if high pressure adhesion at lower temperatures within a shorter time is a requirement. Examples of the peroxide-based initiators include peroxides, such as dibenzoyl peroxide, ditoluoyl peroxide, di-(4-methyl benzoyl) peroxide, di(3,5,5-trimethyl hexanoyl) peroxide and diisobutyl peroxide. These may be used either alone or in combination.

The thermo-settable ingredient (B) is mainly composed of a liquid (meth)acrylic ester. Examples of the liquid (meth)acrylic esters include poly-functional (meth)acrylic esters and mono-functional (meth)acrylic esters. The poly-functional (meth)acrylic esters may be exemplified by alkyl modified di- or tri-functional (meth)acrylic esters, ethylene glycol modified di- or tri-functional (meth)acrylic esters and polyester modified di- or tri-functional (meth)acrylic esters. The mono-functional (meth)acrylic esters may be exemplified by methyl (meth)acrylate, ethyl (meth)acrylate, adamantyl (meth)acrylate and hydroxyethyl (meth)acrylate. Of these, the ethylene glycol modified di- or tri-functional (meth) acrylic esters are most preferred. These poly- and mono-functional (meth)acrylic esters may be used either alone or in combination.

Examples of the phosphorus-containing acrylic esters (b1) include mono (2-acryloyloxyethyl) acid phosphate, mono (2-acryloyloxypropyl) acid phosphate and mono (2-acryloyloxybutyl) acid phosphate. The phosphorus-containing acrylic ester, if added to the composition, advantageously improves the adhesion of the composition to the surface of an inorganic material such as a metal surface. The amount of addition of the phosphorus-containing acrylic ester is preferably 0.01 to 0.5 part by weight and more preferably 0.03 to 0.1 part by weight to 60 parts by weight of the amount of addition of the resin that forms a film and the amount of addition of the liquid (meth)acrylic ester summed together. If the amount of addition of the phosphorus-containing acrylic ester is less than 0.01 part by weight, the hydroxyl-containing acrylic rubber is insufficient in dissolution performance (solubility), whereas, if the amount of addition is greater than 0.5 part by weight, the adhesion strength is inferior.

The hydroxyl-containing acrylic rubber (C) is formed of an acrylic ester containing hydroxyl groups derived from alcohols and an acrylic ester containing carboxyl groups. As regards the molecular weight, the weight averaged molecular weight of the hydroxyl-containing acrylic rubber, as measured by GPC (gel permeation chromatography), is not less than 1000000 and more preferably not less than 1200000. If the weight averaged molecular weight is less than 1000000, there may be cases where sufficient adhesion strength may not be achieved. The amount of addition of the hydroxyl-containing acrylic rubber is preferably 1 to 10 parts by weight and more preferably 2 to 8 parts by weight to 60 parts by weight of the amount of addition of the resin as the film ingredient and that of the liquid (meth)acrylic ester as the film ingredient summed together. If the amount of addition is less than 1 part by weight, there are cases where the adhesion strength may not be developed. If it exceeds 10 parts by weight, there are cases where the hydroxyl-containing acrylic rubber becomes insoluble in the liquid (meth)acrylic ester.

Examples of the organic fine particles (D) include polybutadiene-based fine particles, polystyrene-based fine particles, polyacrylate-based fine particles and polyolefin-based fine particles. Of these, the polybutadiene-based fine particles (d1) are most preferred.

As the electrically conductive particles (E), the electrically conductive particles, thus far used for the anisotropic electrically conductive film, such as particles of nickel, particles of gold, solder particles and resin particles coated with these metals, may be used. The particles may have their surfaces coated with an insulating material. The particle size of the electrically conductive particles is usually 2 to 10 μm and preferably 3 to 5 μm. The amount of addition of the electrically conductive particles is such that for the total volume of 100% of the anisotropic electrically conductive film, inclusive of the electrically conductive particles, the volume of the electrically conductive particles is 1 to 50% and preferably 1 to 30%. If the amount of the electrically conductive particles is less than 1 vol %, the electrically conductive properties may not be obtained, whereas, if the amount exceeds 50 vol %, it may sometimes occur that insulation between connection terminals is difficult to be maintained.

As the phenoxy resin (F), the phenoxy resin having the weight averaged molecular weight of 10000 to 120000 may be used. The phenoxy resin having the weight averaged molecular weight of 40000 to 60000 is most preferred.

A silane coupling agent may be contained in the thermosetting acrylic resin composition of the anisotropic electrically conductive film according to an embodiment of the present invention with a view to improving the adhesion tightness of the composition to the metal. The content of the silane coupling agent is preferably 0.5 to 5 parts by weight and more preferably 1 to 3 parts by weight with respect to the total amount of 35 parts by weight of a polymerized and cured mass of the thermosetting agent (A), thermo-settable ingredients (B) and the hydroxyl-containing acrylic rubber (C) in the resin composition. It is noted that if the content of the silane coupling agent is too small, the desired effect is difficult to be obtained, whereas, if the content is too large, the coating performance is lowered.

If, with the weight X of the acrylic rubber containing the hydroxyl groups (C), the weight Y of the phosphorus-containing acrylic ester (b1) and the weight Z of the polybutadiene-based fine particles (d1), the weight ratio of the three ingredients is such that $X:Y:Z=2:0.05:10\sim 8:0.05:16$, the adhesion strength obtained may be as high as 6N/cm or even higher. With the anisotropic electrically conductive film arranged as described above and having the properly controlled weight ratio of the three ingredients, it is possible to develop the high adhesion strength not less than 6N/cm in a stress relieved state.

With the anisotropic electrically conductive film formed of the thermosetting acrylic resin composition according to an embodiment of the present invention, a high adhesion strength may be developed in the stress-relieved state in case the composition contains at least a thermosetting agent (A), a thermo-settable ingredient (B), an acrylic rubber containing the hydroxyl groups (C), organic fine particles (D) and electrically conductive particles (E), the thermo-settable ingredient (B) includes the phosphorus-containing acrylic ester (b1), the weight averaged molecular weight of the acrylic rubber containing the hydroxyl groups (C) is not less than 1000000, and in case the organic fine particles (D) include the polybutadiene-based fine particles (d1).

In the anisotropic electrically conductive film composed of the thermosetting acrylic resin composition, past efforts in incorporating a hydroxyl-containing acrylic rubber with a weight averaged molecular weight of not less than 1000000 into the film in consideration of the mixing and dissolution performance (compatibility) of the thermo-settable ingredient merely indicated that the mixing and dissolution performance of the acrylic rubber with other ingredients is not optimum. The present inventor conducted eager searches and has found that, by incorporating a phosphor-containing acrylic ester as a thermo-settable ingredient and further by mixing fine particles of the butadiene rubber, the acrylic rubber of a high molecular weight can be mixed and dissolved in the acrylic resin composition. This finding has led to fulfillment of an anisotropic electrically conductive film having a favorable effect that the high adhesion strength may be developed in the stress-relieved state as described above.

With the weight X of the acrylic rubber containing the hydroxyl groups (C), the weight Y of the phosphorus-containing acrylic ester (b1) and the weight Z of the polybutadiene-based fine particles (d1), the weight ratio of the three ingredients may be set so that $X:Y:Z=2:0.05:10\sim 8:0.05:16$ in an embodiment of the present invention. By so doing, the high adhesion strength over 6N/cm may be obtained in the stress-relieved state.

In case the phenoxy resin (F) is further contained in the anisotropic electrically conductive film according to an embodiment of the present invention, the anisotropic electrically conductive film may further be improved in its film-forming properties.

With a connection structure 2 according to an embodiment of the present invention, the substrate 3 carrying an electrode pattern formed thereon is connected to the electronic component 4 by the anisotropic electrically conductive film 1 arranged as described above, as shown in FIG. 1.

With the connection structure according to an embodiment of the present invention, the substrate carrying an electrode pattern of ITO formed thereon is connected to an electronic component by the anisotropic electrically conductive film which anisotropic electrically conductive may allow the high adhesion strength to be developed in the stress relieved state, as described above. It is thus possible to assure the optimum connection performance between the substrate and the electronic component as well as to assure connection reliability for prolonged time.

EXAMPLE

An anisotropic electrically conductive film of the present invention will now be described with reference to an Example of the present invention. This Example will be explained in comparison with Comparative Examples 1 to 5 as tabulated in Table 1.

In the Example, methylethylketone (MEK) is used as a solvent. To 100 parts by weight of MEK, a phenoxy resin, a liquid acrylic ester, a peroxide based initiator, the acrylic rubber containing the hydroxyl groups, a phosphorus-containing acrylic ester, polybutadiene based fine particles, a silane coupling agent and electrically conductive particles were added in proportions (parts by weight) shown in Table 1. The resulting mass was mixed together by a mixer, and the so formed mixture was coated by a bar coater on a polyethylene terephthalate film, 50 μm in thickness, already processed with peeling. The resulting coated product was dried at 80° C. for five minutes to produce an anisotropic electrically conductive film 20 μm in thickness. In the Comparative Examples 1 to 5, coated products were prepared in the same way as in the Example except changing the proportions of the respective ingredients, as shown in the following Table 1. In the Example and in the Comparative Examples 1 to 5, the compatibility and the adhesion strength of the respective samples were measured in a manner as will be indicated hereinbelow.

TABLE 1

| Product names | Names of makers | Names of Ingredients | Ex. | Comp. Ex. 1 | 2 | 3 | 4 | 5 |
|---|---|---|---|---|---|---|---|---|
| YP50 | Toto Kasei KK | Phenoxy resin | 30 | 30 | 30 | 30 | 30 | 30 |
| Light Ester 3EG | Kyoeisha Kagaku KK | Liquid acrylic ester | 30 | 30 | 30 | 30 | 30 | 30 |
| Nyper BW | Nippon Yushi KK | Peroxide based initiator | 3 | 3 | 3 | 3 | 3 | 3 |
| Teisan Resin SG-600LB | Nagase Chem Tec KK | Hydroxyl-containing acrylic rubber | 5 | | | 5 | 5 | 5 |
| Teisan Resin SG-280 | Same as above | Same as above | | 5 | | | | |
| Teisan Resin SG-790 | Same as above | Same as above | | | 5 | | | |
| Light Acrylate P-1A | Kyoeisha Kagaku KK | Phosphorus-containing acrylic ester | 0.05 | 0.05 | 0.05 | 0.05 | | 0.05 |
| RKB | Resinous Kasei KK | Polybutadiene based fine particles | 10 | 10 | 10 | | 10 | 5 |
| KBM-5103 | Shin-etsu Kagaku KK | Silane coupling agent | 2.8 | 2.8 | 2.8 | 2.8 | 2.8 | 2.8 |
| AUL | Sekisui Kagaku KK | Electrically conductive particles | 15 | 15 | 15 | 15 | 15 | 15 |
| Compatibility | | | ○ | ○ | ○ | x | x | Δ |
| Adhesion strength (N/cm) | | | 8 | 5.5 | 4.0 | — | — | — |

Teisan Resin SG-600LB: Mw = 1200000
Teisan Resin SG-280: Mw = 900000
Teisan Resin SG-790: Mw = 520000

(1) Compatibility

The compositions shown in Table 1 were evaluated on visual inspection. The state in which the hydroxyl-containing acrylic rubber was dissolved and completely dispersed was denoted by ○, the state in which the hydroxyl-containing acrylic rubber remained partially non-dissolved was denoted by Δ and the hydroxyl-containing acrylic rubber remaining non-dissolved was denoted by x.

It is seen from the Example and the Comparative Examples 3 and 4 that, to assure mixing and dissolution (compatibility) of the hydroxyl-containing acrylic rubber having the weight averaged molecular weight exceeding 1000000, the existence of the phosphorus-containing acrylic ester and the organic fine particles is indispensable. It is also seen from Table 1 that, to assure mixing and dissolution of the hydroxyl-containing acrylic rubber having the weight averaged molecular weight exceeding 1000000, it is necessary that preset amounts of the phosphorus-containing acrylic ester and the organic fine particles are contained in the composition. In the absence of either one of the phosphorus-containing acrylic ester and the organic fine particles, it was not possible to assure mixing and dissolution of the hydroxyl-containing acrylic rubber having the weight averaged molecular weight exceeding 1000000 (Comparative Examples 3 and 4).

In the Comparative Example 5, the amount of the organic fine particles was set to one-half of that in the case of the Example. In this case, the hydroxyl-containing acrylic rubber could not be made completely compatible, indicating that not less than 10 parts by weight of the organic fine particles were preferable to 5 parts by weight of the hydroxyl-containing acrylic rubber. It was verified in the Example that the hydroxyl-containing acrylic rubber could be made compatible by using 10 parts by weight of the organic fine particles to 5 parts by weight of the hydroxyl-containing acrylic rubber.

(2) Adhesion Strength

Samples of the anisotropic electrically conductive films having the content proportions of the various ingredients as indicated in Table 1 were provisionally mounted on a plurality of ITO glass pieces. Each of the glass pieces was 0.7 mm thick and included an ITO film deposited thereon. A 50-μm pitch FPC (flexible printed circuit board) and the above ITO glass piece were bonded together using an anisotropic electrically conductive film under heating and pressure application (tool temperature: 160° C.; pressure: 4 MPa; time duration of pressure application: 4 sec.). The FPC, thus bonded to the film under pressure application, was cut to a plurality of pieces each 10 mm in width. The end of the FPC, thus bonded, was pulled up in a 90°-direction with respect to the ITO glass piece surface, using a tensile tester marketed under the trade name of the Tensiolon by Orientec Co., Ltd. to measure the adhesion strength. The measured values of the adhesion strength are indicated in Table 1.

In the Comparative Examples 1 and 2, the molecular weights of the acrylic rubber containing hydroxyl groups are lower than in the Example. It may be surmised that, if the molecular weight of the hydroxyl-containing acrylic rubber is low, the force of cohesion between the molecules of the anisotropic electrically conductive film and the surface of the glass piece is lowered to deteriorate the adhesion strength. It may also be surmised that, if the hydroxyl-containing acrylic rubber with a low molecular weight is used, the length of intersecting lines of the network of the hydroxyl-containing acrylic rubber in the anisotropic electrically conductive film becomes shorter, thus further lowering the adhesion strength.

Meanwhile, the molecular weight Mw of Teisan Resin SG-600LB, used in e.g. the Example as the acrylic rubber containing the hydroxyl groups is 1200000, while that of Teisan Resin SG-280 used in Comparative Example 1 is 900000 and that of Teisan Resin SG-790 used in the Comparative Example 2 is 520000.

It is also seen from Table 1 that, with increase in the molecular weight of the hydroxyl-containing acrylic rubber, the force of adhesion becomes higher (Example and Comparative Examples 1 and 2). It may be surmised that the network of the hydroxyl-containing acrylic rubber in the anisotropic electrically conductive film is developed with increase in the molecular weight of the hydroxyl-containing acrylic rubber, thus increasing the force of cohesion between the substrate and the anisotropic electrically conductive film. It may further be surmised that a high adhesive force is demonstrated in case the weight averaged molecular weight of the hydroxyl-containing acrylic rubber exceeds 1000000. It is seen that the molecular weight of the hydroxyl-containing acrylic rubber is preferable to be 1000000 or higher if it is desired to arrive at this value of not less than 6 N/cm in view of the practically usable value of the adhesive force in the anisotropic electrically conductive film of not less than 6 N/cm.

With the Comparative Examples 3 to 5, the acrylic rubber containing the hydroxyl groups could not be made completely compatible such that an anisotropic electrically conductive film could not be prepared. Hence, the adhesion strength was not measured.

With the anisotropic electrically conductive film of the Example of the present invention containing a phosphorus-containing acrylic ester as the thermo-settable ingredient and also containing fine particles of the butadiene rubber as described above, the acrylic rubber of high molecular weight may be mixed and dissolved into the acrylic resin composition. It is thus possible for the acrylic rubber with the weight averaged molecular weight not less than 1000000 to be contained in the composition with the result that high adhesion strength may be obtained in the stress relieved state.

According to an embodiment of the present invention, as described above, the method for dissolving the hydroxyl-containing acrylic rubber with a molecular weight of not less than 1000000, which was hitherto felt to be scarcely possible without difficulties, has now been found. This finding has led to preparation of an anisotropic electrically conductive film.

With the anisotropic electrically conductive film of an embodiment of the present invention, the adhesion strength can be improved in a stress relieved state. Hence, the film can be used as a connection material for a variety of electrical and electronic circuits.

While the present invention has been described with reference to the particular illustrative exemplary embodiments and the drawing, it is not restricted by these embodiments. It is to be appreciated that those skilled in the art can change or modify the exemplary embodiments or perform substitutions by equivalent means without departing from the scope and the spirit of the present invention as defined in the claims.

What is claimed is:

1. An anisotropic electrically conductive film formed of a thermosetting acrylic resin composition, the film comprising:
    a thermosetting agent (A) being a peroxide-based initiator;
    a thermo-settable ingredient (B) including a phosphous-containing acrylic ester (b1);
    an acrylic rubber containing hydroxyl groups (C), wherein the weight averaged molecular weight of the acrylic rubber containing the hydroxyl groups (C) being not less than 1000000;
    organic fine particles (D) being polybutadiene-based fine particles (d1), wherein the amount of the polybutadiene-based fine particles (d2) being not less than 2 times the weight of the acrylic rubber containing the hydroxyl groups (C); and
    electrically conductive particles (E), wherein the adhesive force in the anisotropic conductive film is not less than 6N/cm.

2. The anisotropic electrically conductive film according to claim 1, the film further comprising:
    a phenoxy resin (F), wherein the thermo-settable ingredient (B) further includes a liquid (meth)acrylic ester,
    wherein the amount of the phosphorous-containing acrylic ester (b1) is 0.01 to 0.5 part by weight to 60 parts by weight of the amount of phenox resin (F) and the amount of the liquid (meth)acrylic ester summed together, and
    wherein the amount of the acrylic rubber containing the hydroxyl groups (C) is 1 to 10 parts by weight to 60 parts by weight of the amount of phenoxy resin (F) and the amount of liquid (meth)acrylic acid summed together.

3. A connection structure comprising a substrate having an electrode pattern formed thereon and an electronic component connected to each other by the anisotropic electrically conductive film according to claim 1.

4. A connection structure comprising a substrate having an electrode pattern formed thereon and an electronic component connected to each other by the anisotropic electrically conductive film according to claim 2.

5. The anisotropic electrically conductive film according to claim 1, wherein the weight averaged molecular weight of the acrylic rubber containing the hydroxyl groups (C) is not less than 1200000; and wherein the adhesion strength of the conductive film is no less than 8 N/cm.

6. The anisotropic electrically conductive film according to claim 2, wherein the weight averaged molecular weight of the acrylic rubber containing the hydroxyl groups (C) is not less than 1200000; and wherein the adhesion strength of the conductive film is no less than 8 N/cm.

7. A connection structure comprising a substrate having an electrode pattern formed thereon and an electronic component connected to each other by the anisotropic electrically conductive film according to claim 5.

8. A connection structure comprising a substrate having an electrode pattern formed thereon and an electronic component connected to each other by the anisotropic electrically conductive film according to claim 6.

* * * * *